United States Patent [19]
Ohba et al.

[11] Patent Number: 4,668,873
[45] Date of Patent: May 26, 1987

[54] VEHICLE-MOUNTED ELECTRONIC APPARATUS

[75] Inventors: Masahiro Ohba, Okazaki; Hiroshi Sugimoto, Anjo; Toru Kamiya, Nishio; Toru Yamazaki, Kariya; Hidemichi Tanabe, Nagoya; Satoshi Hirano, Kariya; Hideaki Namba, Oobu; Katsumasa Matsui; Hisahiro Miura, both of Kariya, all of Japan

[73] Assignee: Nippondenso Co., Ltd., Kariya, Japan

[21] Appl. No.: 894,491

[22] Filed: Aug. 4, 1986

Related U.S. Application Data

[63] Continuation of Ser. No. 763,889, Aug. 9, 1985, abandoned, which is a continuation of Ser. No. 579,792, Feb. 15, 1984, abandoned, which is a continuation of Ser. No. 345,795, Feb. 4, 1982, abandoned.

[30] Foreign Application Priority Data

Feb. 6, 1981 [JP] Japan ................................. 56-17167

[51] Int. Cl.[4] .............................................. H02G 3/00
[52] U.S. Cl. .................................... 307/9; 307/10 R; 361/110; 361/395; 361/424
[58] Field of Search ........................... 307/9, 10 R, 90; 361/91, 110, 111, 113, 119, 399, 395, 424, 216; 333/181, 185; 339/17 T; 364/431.03

[56] References Cited

U.S. PATENT DOCUMENTS

| 1,664,494 | 4/1928 | Smith | 361/119 |
| 2,055,057 | 9/1936 | Alben | 307/90 |
| 2,498,824 | 2/1950 | Rady | 307/90 |
| 2,621,252 | 12/1952 | Pontiris | 333/181 |
| 2,714,194 | 7/1955 | Beynink | 339/18 |
| 3,189,847 | 6/1965 | Rymaszewski | 333/1 |
| 3,218,585 | 11/1965 | May | 333/84 |
| 3,221,286 | 11/1965 | Fedde | 339/17 |
| 3,683,271 | 8/1972 | Kobayashi | 361/113 |
| 3,806,767 | 4/1974 | Lehrfeld | 361/412 |
| 3,895,267 | 7/1975 | Gordon et al. | 361/399 X |
| 3,934,074 | 4/1974 | Evelove et al. | 361/399 X |
| 4,465,538 | 8/1984 | Schmoock | 339/17 T X |
| 4,480,240 | 10/1984 | Gould | 361/399 X |

FOREIGN PATENT DOCUMENTS 974384 11/1960 Fed. Rep. of Germany ...... 333/181
879449 11/1943 France ................................. 361/113

OTHER PUBLICATIONS

Source Book of Electronic Circuits, McGraw-Hill Book Company 1968, "Auto Tachometer", p. 65.

Primary Examiner—A. D. Pellinen
Assistant Examiner—Todd E. DeBoer
Attorney, Agent, or Firm—Cushman, Darby & Cushman

[57] ABSTRACT

A case for accommodating an electronic circuit for an electronic control system mounted on a vehicle is formed of an electric conductor and is electrically isolated from the grounding terminal of the electronic circuit which is provided on a printed substrate. Further, the outer boundary of a signal line for signal transmission between the electronic circuit and external circuits or sensors of the case is connected to the case through capacitors, thus preventing the faulty actuation of the electronic control system which otherwise might be caused by the electromagnetic wave.

3 Claims, 2 Drawing Figures

VEHICLE-MOUNTED ELECTRONIC APPARATUS

This is a continuation of application Ser. No. 763,889, filed Aug. 9, 1985, now abandoned, which is a continuation of application Ser. No. 579,792, filed Feb. 15, 1984, now abandoned, which, in turn, was a continuation of application Ser. No. 345,795, filed Feb. 4, 1982, now abandoned.

BACKGROUND OF THE INVENTION

The present invention relates to an electronic apparatus mounted on an automotive vehicle, which is prevented from being erroneously operated by an electromagnetic wave.

In recent years, purification of exhaust gas and energy saving are strongly required of automotive vehicles, and it is an well-known fact that in order to meet such a requirement, an electronic apparatus including a microcomputer is being employed for control of the engine. Such an electronic apparatus must have a very high reliability as it directly affects human life and compliance with the laws. Especially, the recent increase of the radio ham population has increased the opportunity of radio equipment being mounted on an automotive vehicle carrying an electronic device. The vehicle-mounted electronic apparatus is reportedly operated erroneously by the actuation of the radio equipment. In addition to the radio equipment, the radio and television receivers are probably a source of interferences by electromagnetic wave. At a time when increasing number of electronic apparatuses are expected to be mounted on automotive vehicles, it is or urgent necessity to take a positive action against interferences of electromagnetic wave.

SUMMARY OF THE INVENTION

Accordingly, it is an object of the present invention to provide a vehicle-mounted electronic apparatus in which, in order to obviate the abovementioned disadvantage, a signal line leading out of an electronic circuit constructed in a case of an electronic control system mounted on an automotive vehicle is connected to one of the terminals of a capacitor, and the other terminal of the capacitor is constructed of an electric conductor, thus positively preventing the erroneous operation of the electronic control system which otherwise might be caused by electromagnetic wave.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

The present invention will be explained in detail below with reference to an embodiment.

Figure 1:
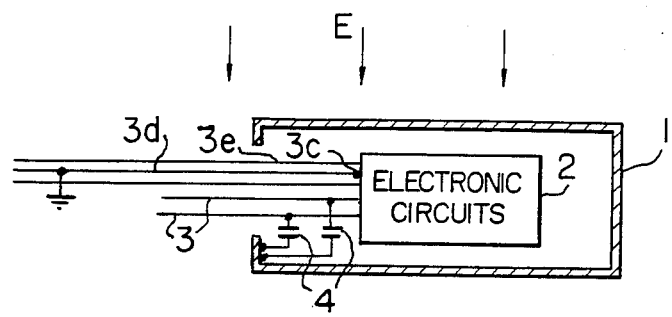
FIG. 1 is a diagram showing a general configuration of a vehicle-mounted electronic apparatus according to an embodiment of the present invention.

FIG. 1 shows the configuration of an embodiment of the vehicle-mounted electronic apparatus according to the present invention.

In FIG. 1, reference numeral 1 designates a case made of an electric conductor, which contains electronic circuits 2 for an electronically-controlled fuel injection system, an ignition timing control system, a display control system and the like electronic control systems. The electronic circuits 2 are connected with signal lines 3 each including an input signal line for receiving various input signals from outside of the case 1 and output signal lines for transmitting an output signal outside of the case 1. Further, the grounding terminal 3c of the electronic circuits 2 is led out of the case 1 through a ground wire 3d and is thus electrically isolated from the case 1 by insulation 3e. The signal lines 3 are connected through capacitors 4 to the case 1 so that high frequency noises of electromagnetic wave mixed in the signal lines 3 are absorbed by the bypass of the case 1.

In this construction, assume that an electromagnetic wave is radiated on the electronic apparatus in the direction of E. The electromagnetic wave radiated on the surface of the case 1 of an electric conductor is reflected on the surface of the case and is not allowed in the case. Further, the high frequency current in each of the signal lines 3 induced by the electromagnetic wave flows to each of the bypass capacitors 4. Since a terminal of each of the bypass capacitors 4 is connected to the conductor portion of the case 1, all the high frequency current (high frequency noises) flows into the case 1. This high frequency current is transmitted along the surface of the conductor and, by way of the aperture for the signal lines 3, is led out of the case 1. In view of the fact that the case-side terminal of each of the bypass capacitors 4 is isolated from the earth line of the electronic circuits 2, the high frequency current does not flow through the earth line of the electronic circuits 2. As a result, the adverse effect on the electronic circuits 2 can be prevented thereby to secure normal operation of the electronic circuits 2. In the foregoing descriptions, the wire leading out of the electronic apparatus concerns an input signal. In the case where a return line for the input signal or an output signal processed by the electronic apparatus is usually included, however, a bypass capacitor for high frequency current is of course also inserted in the return line for the input signal or the output signal line as the case may be.

The relation between a conductor disposed in a free space and electromagnetic wave will be studied. For convenience' sake, let us quote "The Radio Communication Engineering Vol. 1", by Hideo Iwakata, published from Corona. In the case where a plane wave with an alternately-changing electromagnetic field enters a conductor, Maxwell's equation in the conductor is expressed as $$\nabla^2 \mathbb{E} = j\omega\mu(\sigma+j\omega\epsilon)\mathbb{E} = P^2 \mathbb{E} \qquad \ldots\ldots\ldots (1)$$

$$\nabla^2 \mathbb{H} = j\omega\mu(\sigma+j\omega\epsilon)\mathbb{H} = P^2 \mathbb{H} \qquad \ldots\ldots\ldots (2)$$

where
 $\mathbb{E}$: Electric field
 $\mathbb{H}$: Magnetic field
 $\mu$: Magnetic permeability of the conductor
 $\sigma$: Conductivity of the conductor
 $\epsilon$: Dielectric constant of the conductor
 $\omega$: Angular frequency of electromagnetic wave $P = \sqrt{j\omega\mu(\sigma + j\omega\epsilon)}$ : Natural propagation constant Assume that the direction of the plane wave is toward the origin along the ordinate (Y axis), the direction of the electric field along the abscissa (X axis), and the direction of the magnetic field along the Z axis. When a set of Ex and Hz is considered, the equation below is obtained from equation (1).

$$\frac{\partial^2 E_x}{\partial y^2} = P^2 E_x \qquad (3)$$

The solution of this equation is given as $$E_x = E_{\gamma'} e^{Py} + E_{\gamma''} e^{-Py} \qquad (4)$$

The first term of the equation (4) represents an incident wave passing toward the origin along the ordinate, and the second term thereof a reflected wave passing away from the origin. Characters $E_{\gamma'}$, $E_{\gamma''}$ represent the electric field intensity of the incident wave and the reflected wave respectively at the origin. The relation between $E_x$ and $H_z$ is given by the equation (5) below.

$$\frac{\partial E_x}{\partial y} = j\omega\mu H_z \qquad (5)$$

When equation (4) is substituted into equation (5) to obtain the value of $H_z$, $$H_z = H_{\gamma'} e^{Py} + H_{\gamma''} e^{-Py} \qquad (6)$$

where $$H_{\gamma'} = \frac{P}{j\omega\mu} E_{\gamma'} \qquad (7)$$

$$H_{\gamma''} = \frac{P}{j\omega\mu} E_{\gamma''} \qquad (8)$$

$H_{\gamma'}$ and $H_{\gamma''}$ above show the magnetic field intensity of the incident wave and the reflected wave respectively at the origin.

The impedance Zo of the conductor, which is the ratio between the electric field and magnetic field, is given as $$Z_o = \frac{E_{\gamma'}}{H_{\gamma'}} = \frac{E_{\gamma''}}{H_{\gamma''}} = \frac{j\omega\mu}{P} = \frac{P}{\sigma+j\omega\varepsilon} = \sqrt{\frac{j\omega\mu}{\sigma+j\omega\varepsilon}} \quad (9)$$

In the case of a conductor, $\sigma >> \omega\varepsilon$, and therefore the equation (10) below is obtained from equation (9).

$$Z_o = \sqrt{\frac{j\omega\mu}{\sigma}} = \sqrt{\frac{\omega\mu}{2\sigma}}(1+j)$$

$$= \sqrt{\frac{\omega\mu}{\sigma}} e^{j\theta} \quad (\theta = 45°) \qquad (10)$$

Equation (10) indicates that the impedance of the conductor has equal resistance and reactance components and that the electric field and the magnetic field have a phase difference of 45 degrees. If the conductor is mad of aluminum, the impedance Zo at 100 MHz is determined as below.

$$\sigma = 3.72 \times 10^7 \text{ (U/m)}$$

$$\mu = 4\pi \times 10^{-7} \text{ (H/m)}$$

$$\omega = 2\pi \times 10^8$$

By substituting these values into equation (10), $Z_o = 0.0033 (1+j) (\Omega)$, which is considerably small as compared with the intrinsic impedance 377 $\Omega$ of the air.

When the plane wave enters this conductor, the reflection coefficient $\gamma_R$ and the transmission coefficient $\gamma_T$ of the plane wave are given as $$\gamma_R = \frac{Z_{02} - Z_{01}}{Z_{02} + Z_{01}} \qquad (11)$$

$$\gamma_T = \frac{2Z_{02}}{Z_{02} + Z_{01}} \qquad (12)$$

where $Z_{01}$ is the impedance of the air and $Z_{02}$ is the impedance of the conductor. Substituting $Z_{02} = 0.0033$ and $Z_{01} = 377$, $$\gamma_R \approx -1, \gamma_T \approx 0$$

This is indicative of the fact that the plane wave entering the conductor is reflected in its entirety on the surface of the conductor with no component thereof entering inside of the conductor.

From the foregoing study, it is seen that the impedance of a conductor disposed in a free space is very small in the case of an alternating electromagnetic wave of high frequency and that the electromagnetic wave is prevented from entering the inside of a curved surface which is closed and formed of a conductor but is reflected in its entirety on the surface of the conductor. Thus the connection of the signal lines 3 of the electronic apparatus to the conductor case 1 by way of the capacitors 4 is considered equivalent to the grounding of the input-output lines of an electronic apparatus in general. It is also seen that since the electromagnetic wave is all reflected on the surface of the conductor of the electronic apparatus, considering the input and output lines is sufficient for preventing the interference of the electromagnetic wave. In this case, the earth line 3d of the electronic circuits 2 and the conductor case 1 are required to be insulated by insulation 3e in DC fashion as clear from the foregoing explanations.

Figure 2:
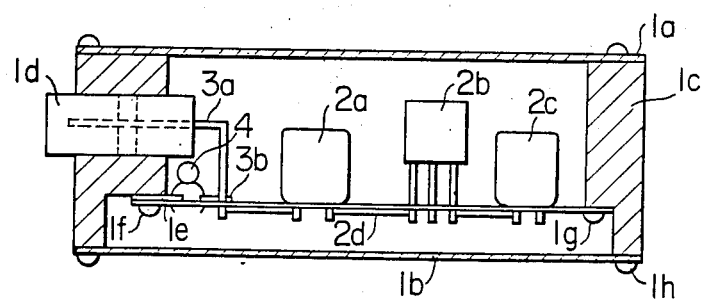
FIG. 2 is a diagram showing a detailed configuration of the apparatus according to the present invention shown in FIG. 1.

A detailed construction of the vehicle-mounted electronic apparatus of FIG. 1 according to the present invention is shown in FIG. 2.

In FIG. 2, numerals 1a and 1b designate "covers" of the case of the electronic apparatus, which are screwed to the upper and lower parts of the case body 1c with screw 1h respectively. The covers 1a and 1b and the case body 1c are made of electrically conductive material such as aluminum or iron. Numeral 1d designates a connector housing made of synthetic resin, and numeral 3a an L-shaped connector input terminal with an end thereof connected to a copper foil pattern 3b on a printed substrate 2d. Numeral 4 designates capacitors each forming a bypass for the high frequency current, an end thereof is connected to a connector pin 3a through the copper foil pattern 3b. Numeral 1e designates another copper foil pattern on the printed substrate 2d, which is connected with the other terminal of each of the bypass capacitors 4. The pattern 1e is in firm contact with the case body 1c through the substrate-mounting screws 1f and 1g so that the high frequency current entering the case through the connector pin 3a flows to the case body 1c through one of the bypass capacitors 4 and the pattern 1e. As a result, the high frequency current is prevented from flowing into the electronic circuits 2 through the electronic elements 2a (LSI for microcomputer), 2b (transistor) and 2c (LSI for microcomputer) constructed on the printed substrate, thereby preventing the faulty actuation of the electronic circuits 2 on the printed substrate which otherwise might be caused by the high frequency current. Incidentally, the earth line 3d for the electronic circuits 2 on the printed substrate is insulated by insulation 3e in DC fashion from the case body 1c.

It will thus be understood from the foregoing description that according to the present invention a signal line leading out of an electronic circuit formed inside of the case of the electronic apparatus is connected with one of the terminals of bypass capacitors for high frequency current, and the other terminal of each of the bypass capacitors is connected to the case made of an electric conductor. With this simple construction, the high frequency current induced in the signal line by the electromagnetic wave flows again out of the case through the bypass capacitors and is prevented from flowing through the electronic circuit in the case. Also, the electromagnetic wave in the air is reflected on the case, thus positively preventing the faulty actuation of the electronic circuit which otherwise might be caused by the electromagnetic wave.

We claim:

1. A vehicle-mounted electronic apparatus comprising:
   an electronic circuit for an electronic control system for a vehicle, said circuit including a substrate having printed foil patterns and electronic parts mounted at fixed positions to said foil patterns, said foil patterns interconnecting said electronic parts and completing said circuit, each of said foil patterns having an input-output area;
   a case of a box type made of an electronic conductor for accommodating said electronic circuit, said case being insulated in electronic DC fashion from an earth terminal of said electrical circuit, said case shielding said circuit from electromagnetic waves external to said case, said case including connector means for communicating signals through one part of said case;
   a plurality of signal line means for transmitting signals between said electronic circuit and said connector means of said case, one end of each of said signal line means being electrically connected to said input-output area of said foil patterns;
   a copper foil pattern provided near said input-output area of said printed foil patterns to which said one end of each of said signal line means is connected, said copper foil pattern being separated from said printed foil patterns, a contact portion of said copper foil pattern being in direct mechanical and electrical contact with said case;
   a plurality of capacitors, one connected between said input-output area of each said printed foil patterns to which each said one end of said signal line means is connected and said copper foil pattern at a position closely adjacent to said contact portion directly contacting said case, respectively, for bypassing electromagnetic wave noise, the capacitance of each of said capacitors being selected to take out high frequency electromagnetic wave noise; and
   means for holding said contact portion of said copper foil pattern in direct mechanical contact with said case.

2. A vehicle-mounted electronic apparatus according to claim 1, wherein said case includes a connector housing, and said signal line means include connector pins disposed in said connector housing and extending to said electronic circuit, and said connector means includes screws extending through said substrate and into said case for holding said copper foil pattern in direct contact with said case.

3. A vehicle-mounted electronic apparatus according to claim 2, wherein one terminal of each of said capacitors is connected to said electronic circuit adjacent to and in electrical conduction with the point where one of said pins is connected to said electronic circuit, respectively.

* * * * *